United States Patent [19]

Bender et al.

[11] Patent Number: 4,949,222
[45] Date of Patent: Aug. 14, 1990

[54] ELECTRICAL APPARATUS COMBINATION

[75] Inventors: Peter Bender, Wädenswil; Maruizio Bellé, Richterswil, both of Switzerland

[73] Assignee: Feller AG, Horgen, Switzerland

[21] Appl. No.: 396,930

[22] Filed: Aug. 22, 1989

[30] Foreign Application Priority Data

Aug. 29, 1988 [CH] Switzerland .......................... 3197/88

[51] Int. Cl.⁵ .............................................. H05K 7/02
[52] U.S. Cl. .................................... 361/400; 361/392
[58] Field of Search ................................ 361/392–395, 361/400, 404, 405–406

[56] References Cited

U.S. PATENT DOCUMENTS 2,802,995 8/1957 Mautone et al. ..................... 361/400
3,227,926 1/1966 Parstorfer et al. ................... 361/392
3,940,666 2/1976 Chesney et al. ..................... 361/393
4,737,903 4/1988 Nishikawa et al. .................. 361/400

Primary Examiner—Gregory D. Thompson
Attorney, Agent, or Firm—Laurence R. Brown

[57] ABSTRACT

The electrical apparatus combination includes a plurality of electrical components which are for instance an outlet apparatus socket, an inlet apparatus plug, an apparatus switch and a filter which in order to allow an electrical interconnection are arranged on a printed circuit board onto the reverse side of which conductors are placed onto which contact members such as contact prongs located in each electrical component and plugged onto the circuit board are soldered. A releasably mounted protective cover protects the bottom side of the printed circuit board which comprises the conductors and confers additional stability to the apparatus combination. The printed circuit board replaces the otherwise necessary electrical wiring between a plurality of electrical components having various functions.

4 Claims, 1 Drawing Sheet

ELECTRICAL APPARATUS COMBINATION

BACKGROUND OF THE INVENTION

1. Field of the Invention

The present invention relates to an electrical apparatus combination having a plurality of functionable electrical components which are interconnected electrically.

2. Description of the Prior Art

Such electrical components are generally switches, inlet apparatus plugs, outlet apparatus sockets as well as filters and other devices which in accordance with prevailing applications are combined in a certain combination and structural entity which includes a plurality of functions. The structural entity can include as electrical components for instance an inlet apparatus plug for a power supply cable and immediately adjacent thereto an outlet apparatus socket such that from an electrically operated first apparatus in which such an apparatus combination is integrated, a second apparatus can be supplied with electrical power. A switch present in the apparatus combination as a further electrical component allows the switching on and switching off of the apparatus located at the outlet side. Furthermore, such apparatus combination can include as a further component a filter.

All these electrical components must be interconnected electrically which could be accomplished by wiring which entails, however, intricate work.

SUMMARY OF THE INVENTION

It is a general object of the present invention to provide an electrical apparatus combination which avoids an intricate wiring and realizes instead a modular assembly of electrical functions and includes an electrical power transmitting means which replaces the wiring and simplifies the production of the apparatus combination considerably.

A further object of the present invention is to provide an electrical apparatus combination which has at least two electrical components, each including one base consisting of an insulating material and contact members arranged therein, which electrical components are located in a row adjacent to each other and are plugged onto and soldered to a printed circuit board designed as an electrical energy transmitter by means of said contact members, which electrical components are interconnected electrically by conductors mounted onto the reverse side of the printed circuit board and interconnecting soldered junctions.

The energy transmitter in the form of a printed circuit board allows the modular design of the apparatus combination and its extent depends on a respective set of technical demands and includes at least two electrical components.

Yet a further object is to provide an electrical apparatus combination which includes a printed circuit board having a protective cover which forms at the one hand a protection against electric-shock hazard and at the other hand adds to the stability of the apparatus combination. The apparatus combination having a printed circuit board as energy transmitter allows a modular structuring of electrical functions in general and in a technical form which can be handled easily by the user and regarding its production leads to an optimal economy.

BRIEF DESCRIPTION OF THE DRAWINGS

The invention will be better understood and objects other than those set forth above will become apparent when consideration is given to the following detailed description thereof. Such description makes reference to the annexed drawings wherein.

DESCRIPTION OF THE PREFERRED EMBODIMENTS

Figure 1:
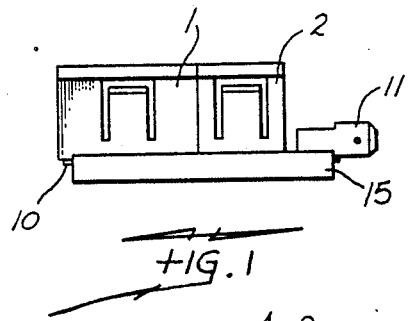
FIG. 1 is a side view of an apparatus combination having two electrical components.

The embodiment of the electrical apparatus combination illustrated in FIG. 1 includes as electrical components an outlet apparatus socket 1 and an inlet apparatus plug 2 located adjacently thereof. Every component comprises a base 3 consisting of an insulating material and contact members 4 arranged fixedly therein, and specifically per component three contact members 4 for the phase, neutral and ground conductors. The contact members 4 of the outlet apparatus socket 1 are contact bushes and of the inlet apparatus plug 2 are terminal prongs.

Figure 3:
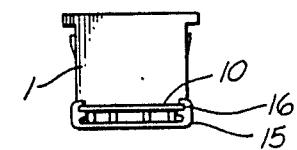
FIG. 3 is a view of the narrow side of the apparatus combination of FIG. 1.
Figure 2:
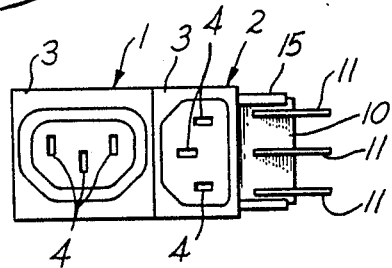
FIG. 2 is a top view of the apparatus combination of FIG. 1.
Figure 4:
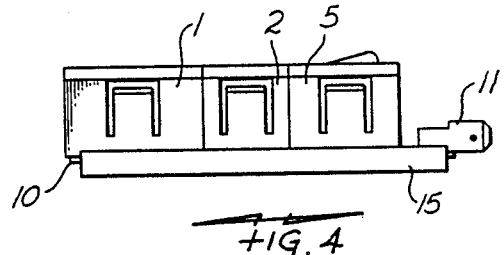
FIGS. 4 and 5 are a side view and a top view, respectively, of a further apparatus combination having three electrical components.
Figure 5:
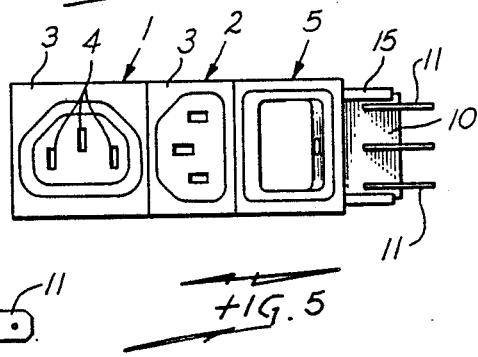

The apparatus combination according to FIGS. 4 and 5 differs from that of FIGS. 1-3 merely in that additionally an apparatus switch 5 is located adjacent the input apparatus plug 2 such that this apparatus combination includes totally three electrical components.

Figure 6:
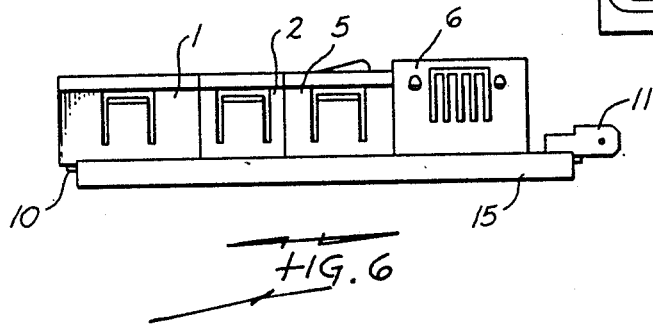
FIGS. 6 and 7 are a side view and a top view of a further apparatus combination having four electrical components.
Figure 7:
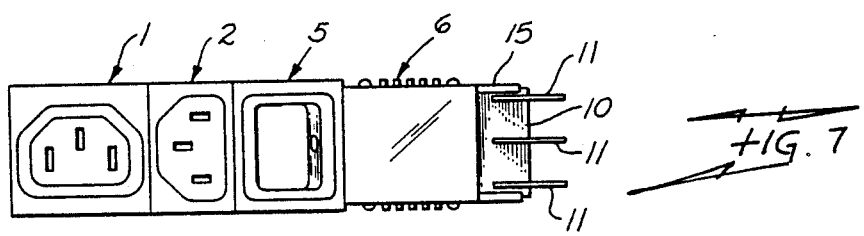
Figure 8:
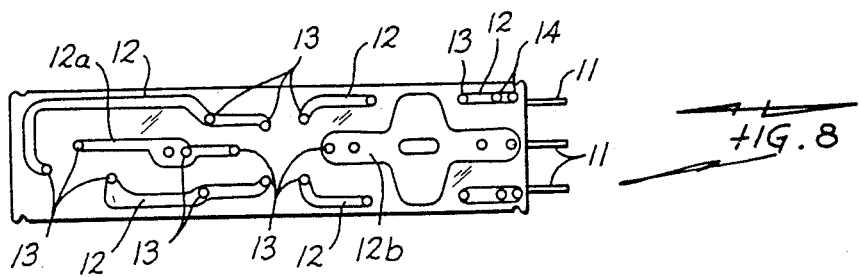
FIG. 8 is a top view of the reverse side of the printed circuit board used in the apparatus combination illustrated in FIGS. 6 and 7.

The apparatus combination according to FIGS. 6-8 includes, in addition to the three electrical components of the apparatus combination according to FIGS. 4 and 5, a filter 6 adjacent the apparatus switch 5, such that this embodiment includes totally four electrical components.

The above mentioned electrical contact members 4 present in the individual electrical components, such as for instance the terminal prongs or the contact bushes, are plugged at their pluggable lower end into a printed circuit board 10 such that they project somewhat out of the reverse side of this printed circuit board. The reverse side of this printed circuit board 10 is illustrated in FIG. 8 which particular circuit board belongs to the embodiment in accordance with FIGS. 6 and 7 having four electrical components. The circuit board is somewhat longer than the four electrical components arranged in a row adjacent to each other such to allow the mounting of three connection contact terminals 11 for the phase, neutral and ground conductors at its right hand end. The apparatus combination is connected with these connection contact terminals 11 in an electrical apparatus to which the electrical current is supplied therewith.

The printed circuit board 10 of which the reverse, i.e. outwards facing side, is shown in FIG. 8 is designed correspondingly shorter in the embodiment illustrated in FIGS. 1-3 or the embodiment illustrated in FIGS. 4 and 5.

It has been mentioned earlier that contact members 4 are provided in every electrical component 1, 2, 5 and 6 which represent an outlet apparatus socket, an inlet apparatus plug, a switch and a filter, by means of which contact members 4 of the electrical components are plugged onto the printed circuit board 10. The ends of these contact members 4 projecting at the reverse side of the printed circuit board 10 onto which the conductors 12 are mounted, are soldered onto these conductors 12 such that the soldered junctions 13 are always located on a conductor 12. The phase conductor connections and the neutral conductor connections run along the longitudinal outer edges of the printed circuit board and the ground or protective conductor connections run in the center therebetween.

The conductor 12 for this ground conductor connections is, as shown in FIG. 8, not designed as running uninterrupted over the entire length of the printed circuit board and includes an interruption or gap between conductor sections 12a and 12b, which interruption is bridged at the apparatus switch 5 by an electrical connection forming a bypass and extending within this apparatus switch 5. The two outer conductors 12 which serve as phase conductor connections and as neutral conductor connections are also interrupted at the location of the apparatus switch 5 because this switch makes or breaks respectively the electrical switching connection by means of its own contacts located within. The gap or interruption between the conductor sections 12a and 12b of the neutral conductor connection running along the center is here described as variant and special case for structural reasons, namely if an apparatus switch 5 which has been procured from a foreign manufacturer has contact elements arranged at a small distance such that a two small and unallowable distance between the outer conductor for the phase and the center conductor for the protective line would occur.

The connection contact members 11 at the one end of the printed circuit board 10 are connection prongs mounted to the circuit board by means of two soldered junctions 14 arranged at a small mutual distance at the reverse side of the circuit board 10.

The side of the printed circuit board 10 which comprises the conductors 12 is equipped with a protective cover 15 mounted in a snapped in fashion over the edges of the circuit board 10. The protective cover has a U-shaped cross-section and each leg thereof includes a groove shaped recess 16 in which the printed circuit board 10 is held at its longitudinal edges. The protective cover 15 consists of a material which allows the legs to elastically snap over the edges of the circuit board. The protective cover forms a protection against electric-shock hazard and acts as a stiffener and stabilizer of the entire apparatus combination. The outer side of this protective cover 15 serves additionally as surface for a labelling in order to allow a printing of characteristic data and further information regarding the particular apparatus combination.

While there are shown and described present preferred embodiments of the invention, it is to be distinctly understood that the invention is not limited thereto, but may be otherwise variously embodied and practiced within the scope of the following claims.

We claim:

1. Electrical apparatus for connecting an external power supply cable to other electrical apparatus comprising in combination a plurality of electrical components which are interconnected electrically into an integrated energy transmitter modular unit comprising at least plug and socket electrical power cable connection components, each component including one base consisting of an insulating material and contact members arranged therein for carrying electrical power between a power supply cable connected thereto and said other electrical apparatus, which plug and socket are located adjacent to each other and are plugged onto a printed circuit board panel having parallel side edges by means of said contact members and are interconnected electrically to conductors mounted onto the reverse side of said printed circuit board panel from the components by interconnecting soldered junctions to form the modular unit, and a protective cover panel mounted in a snapped fashion over the side edges of the circuit board panel to produce a protective function to said contact members and conductors, structural reinforcement of the apparatus, and an outer surface for labelling.

2. The electrical apparatus combination of claim 1, further comprising connection contact terminals located at one end of the unit for connection to respective ones of said plug and socket contact members and said other electrical apparatus.

3. The electrical apparatus combination of claim 1, wherein said electrical components further comprise an apparatus switch and a filter, which components are connected in a row arranged on said printed circuit board.

4. The electrical apparatus combination of claim 1, wherein said conductors mounted on said printed circuit board further comprise two separated ground conductor connections having a point of interruption therebetween, which point of interruption is bridged by an electrical connection extending through a further one of said electrical components and forming a bypass switch.

* * * * *